United States Patent [19]
Britt et al.

[11] Patent Number: 5,557,146
[45] Date of Patent: Sep. 17, 1996

[54] OHMIC CONTACT USING BINDER PASTE WITH SEMICONDUCTOR MATERIAL DISPERSED THEREIN

[75] Inventors: Jeffrey S. Britt; Christos S. Ferekides, both of Tampa, Fla.

[73] Assignee: University of South Florida, Tampa, Fla.

[21] Appl. No.: 91,648

[22] Filed: Jul. 14, 1993

[51] Int. Cl.$^6$ .................. H01L 31/0224; H01L 29/43
[52] U.S. Cl. .................. 257/741; 257/743; 257/744; 136/256
[58] Field of Search .................. 257/742–744, 257/442, 441, 750, 762, 461, 741; 136/256, 260, 265

[56] References Cited

U.S. PATENT DOCUMENTS

| | | | |
|---|---|---|---|
| 3,253,951 | 5/1966 | Marinaccio et al. | 177/212 |
| 3,434,885 | 3/1969 | Mandelkorn et al. | 136/89 |
| 4,025,944 | 5/1977 | Moon | 357/67 |
| 4,074,305 | 2/1978 | Johnston, Jr. et al. | 357/67 |
| 4,163,678 | 8/1979 | Bube | 146/89 CC |
| 4,219,448 | 8/1980 | Ross | 252/500 |
| 4,327,119 | 4/1982 | Lis et al. | 427/74 |
| 4,336,281 | 6/1982 | van Mourik | 427/74 |
| 4,347,262 | 2/1983 | Marcus | 427/74 |
| 4,375,007 | 2/1983 | Marcus | 136/256 |
| 4,456,630 | 6/1984 | Basol | 427/88 |
| 4,650,921 | 3/1987 | Mitchell | 136/258 |
| 4,666,569 | 5/1987 | Basol | 204/34.5 |
| 4,680,611 | 7/1987 | Basol | 357/71 |
| 4,734,381 | 3/1988 | Mitchell | 437/5 |
| 4,735,662 | 4/1988 | Szabo et al. | 136/256 |
| 4,737,197 | 4/1988 | Nagahara et al. | 136/256 |
| 4,959,106 | 9/1990 | Nakagawa et al. | 257/56 |
| 5,293,074 | 3/1994 | Taskar et al. | 257/744 |

FOREIGN PATENT DOCUMENTS

| | | | |
|---|---|---|---|
| 0168072 | 7/1989 | Japan | 257/744 |
| 0168071 | 7/1989 | Japan | 257/744 |
| 0175774 | 7/1989 | Japan | 257/744 |

OTHER PUBLICATIONS

Translation of Japan Koki Publication No. 01-0175774 Jul. 1989; 13 pp.
Abstract citation of Publication entitled True Potential Energy Curves, r-Centroids and Franck–Condon Factors of a Few Transition Metal Diatomic Molecules, Ramanaiah et al., Pramana, vol. 22, No. 1, pp. 11–16, Jan. 1984.
Mercury Telluride as an Ohmic to Efficient Thin Cadmium Telluride Solar Cells, Chu et al., 20th IEEE Photovoltaic Specialists Conf., Las Vegas, NV, Sep. 1988, pp. 1422–1425.
Ohmic Contacts and Doping of CdTe, Fahrenbruch, Solar Cells, 21 (1987) 399–412; Paper presented at the 7th Photovoltaic Advanced Research and Development Project Review Meeting, Denver, CO, May 13, 1986.

*Primary Examiner*—Peter Toby Brown
*Attorney, Agent, or Firm*—Calfee, Halter & Griswold

[57] ABSTRACT

An ohmically conductive contact for a thin film p-type semiconductor compound formed of at least one of the metal elements of Class IIB of the Periodic Table of Elements and at least one of the non-metal elements of Class VIA of the Periodic Table of Elements and photovoltaic devices incorporating such contacts. An ohmic contact, according to the invention, includes a layer of conductive binder paste having mercury telluride and/or copper telluride dispersed therein. The invention also relates to a method of forming such ohmic contacts.

16 Claims, 1 Drawing Sheet

OHMIC CONTACT USING BINDER PASTE WITH SEMICONDUCTOR MATERIAL DISPERSED THEREIN

FIELD OF THE INVENTION

The present invention relates generally to photovoltaic cells using semiconductor Class IIB-VIA compounds and specifically to a method for forming ohmic contacts with thin film p-type Class IIB-VIA semiconductor compounds. These films and contacts are particularly important to the conversion of solar energy into electrical energy by means of solar cells.

BACKGROUND OF THE INVENTION

There is a growing consensus that the collection of solar energy and its conversion to electrical energy by means of photovoltaic devices should be included in the energy mix of the near future. The commercialization of photovoltaic devices depends on technological advances that lead to higher efficiencies, lower cost, and stability of such devices. The cost of electricity can be significantly reduced by using solar modules constructed from inexpensive thin film polycrystalline semiconductors such as copper indium diselinide or cadmium telluride. Both materials have shown great promise, but certain difficulties have to be overcome before their commercialization.

Based on its physical properties, cadmium telluride has been recognized for some time as one of the leading candidates for photovoltaic applications. However, the difficulty of achieving a low-resistance ohmic contact to cadmium telluride solar cells has hindered the commercialization of these devices. An economical solution to this problem would clear one of the remaining hurdles of commercializing cadmium telluride photovoltaic modules.

The difficulty in obtaining a low resistance ohmic contact with thin films of p-type polycrystalline Class IIB-VIA semiconductors is partially due to the fact that such films exhibit relatively high resistivities. Bypassing this problem is usually achieved by lowering the semiconductor surface resistivity. Typically, acidic solutions such as $HNO_3$+$K_2Cr_2O_7$+$H_2O$, $HNO_3$+$H_3PO_4$+$H_2O$, $H_2SO_4$+$K_2Cr_2O_7$+$H_2O$ and bromine methanol are used to etch the semiconductor. These solutions have been found to leave a surface rich in Class VIA element. Such a surface results in an enhanced electrical contact between a metal and the p-type semiconductor.

Nevertheless, contacts formed to the thin films of cadmium telluride using metals are in general unstable due to metal diffusion into the polycrystalline semiconductor. While a portion of the metal reacts with the semiconductor surface to form an electrical contact, the excess metal diffuses into the semiconductor creating shorts and resulting in degradation of the properties of the photovoltaic device. Limiting the amount of metal deposited, so that diffusion into the semiconductor will have a negligible effect has been found to produce satisfactory results. However, because the thickness of the metal has been reduced, the resulting metal film has a relatively high resistivity (sheet resistance).

As disclosed in U.S. Pat. No. 4,680,611, a second metal layer that forms a stable contact with the first metal is needed in order to further reduce the overall contact sheet resistance and improve solar cell characteristics. A first layer of copper and a second layer of nickel is disclosed as the preferred metal combination for a contact to a IIB-VIA thin film semiconductor.

U.S. Pat. No. 4,735,662 discloses, however, that copper-nickel contacts to CdTe film are unsatisfactory. This patent discloses that because nickel has a relatively low resistivity, it must be deposited in a relatively thick layer to achieve acceptable resistance. Thick films of nickel are mechanically unstable and will oxidize over time and flake off under the influence of internal stresses. U.S. Pat. No. 4,735,662 discloses that satisfactory copper-nickel contacts can be produced by depositing a relatively thin layer of nickel, followed by an isolation layer to protect the nickel layer from oxidation and to provide sufficient metal thickness for bonding of an external contact. The isolation layer may be formed of carbon.

Rather than contacting the semiconductor layer directly with a metal, another method of forming an ohmic contact to the IIB-VIA semiconductor is to deposit a second IIB-VIA semiconductor onto the first semiconductor layer. This second semiconductor layer presents no obstacles to the formation of a low resistivity contact. A requirement for selecting this second semiconductor is that the interface of the two semiconductors does not impede current flow. Zinc telluride and mercury telluride are examples of such semiconductors used for forming low resistance ohmic contacts with cadmium telluride.

Graphite paste has been used as a contact to CdTe solar cells, but this contact suffers from a high series resistance. To improve the resistance of the contact, salts of silver, copper, gold and mercury have been added to the graphite paste. The results, however, have been less than satisfactory because of poor diode characteristics.

Mercury telluride has been used as an ohmic contact to thin film cadmium telluride solar cells. P-type HgTe is deposited by evaporation onto the surface of p-type CdTe. The resulting HgTe layer provides a low resistance contact to the CdTe, but this process is expensive and difficult to control.

It is therefore an object of the present invention to provide a low resistance, economically feasible ohmic contact to thin film p-type semiconductor Class IIB-VIA compounds.

It is a further object of the present invention to provide a method for forming such contacts.

These and other objects of the present invention will become apparent to those skilled in the art in the following description of the invention and in the appended claims.

SUMMARY OF THE INVENTION

The invention relates to an ohmically conductive contact for a thin film p-type semiconductor compound formed of at least one of the metal elements of Class IIB of the Periodic Table of Elements and at least one of the non-metal elements of Class VIA of the Periodic Table of Elements comprising a layer of conductive binder paste having mercury telluride and/or copper telluride dispersed therein.

The invention also relates to a method of forming ohmic contacts to a thin film p-type semiconductor compound of a semiconductor device formed of at least one of the metal elements of Class IIB of the Periodic Table of Elements and at least one of the non-metal elements of Class VIA of the Periodic Table of Elements, which method comprises: (a) treating the surface of the film to form a surface rich in the VIA element; (b) depositing a layer of a conductive binder paste having a semiconductor material such as mercury telluride and/or copper telluride dispersed therein; and (c) causing a reaction between the semiconductor material and the p-type semiconductor compound.

The invention further relates to a thin film photovoltaic device having a transparent substrate, a conductive transparent film formed on the substrate, an n-type semiconductor layer formed on the conductive film, a p-type semiconductor layer deposited onto the n-type semiconductor layer and forming a junction therewith, and an ohmically conductive contact layer disposed over the p-type semiconductor layer; the ohmically conductive contact comprising a layer of conductive binder paste having mercury telluride and/or copper telluride dispersed therein.

DETAILED DESCRIPTION OF THE INVENTION

Figure 1:
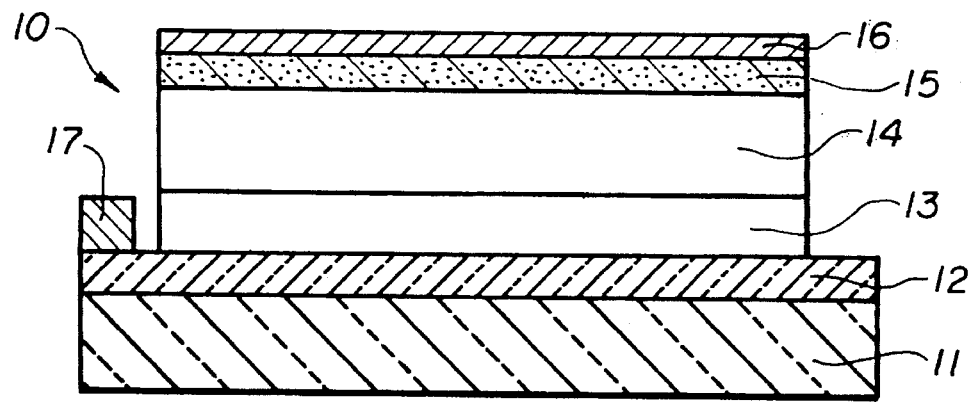
FIG. 1 is a schematic cross-sectional view of constructed in accordance with the present invention.

Referring to FIG. 1, a photovoltaic cell 10 prepared in accordance with the present invention includes a substrate 11 of insulating transparent material such as glass. On substrate 11 is deposited a layer 12 of transparent electrically conductive material, such as tin oxide ($SnO_2$). On layer 12 is deposited a layer 13 of n-type semiconductor material, such as cadmium sulfide (CdS). Layers 12 and 13 combined comprise an n-type wide band-gap semiconductor structure. On layer 13 is deposited a thin film 14 of a p-type semiconductor compound formed of at least one of the metal elements of Class IIB of the Periodic Table of Elements and one of the non-metal elements of Class VIA of the Periodic Table of the Elements. Thin film layer 14 is preferably either CdTe or HgCdTe. On the surface of layer 14 is deposited a layer 15 of conductive binder paste containing a powdered semiconductor material of at least one of the metal elements of Class IB and/or IIB of the Periodic Table of Elements and one of the non-metal elements of Class VIA of the Periodic Table of Elements dispersed therein. Preferably, the conductive binder paste is graphite paste. A film 16 of conductive metal may be deposited on the conductive binder layer 15. Film 16 is necessary when the surface resistivity of layer 15 is greater than about 10 $\Omega/\square$. Layer 15 and layer 16, if it is present, make up the ohmically conductive contact to the thin film p-type semiconductor compound. A layer 17 of a metal such as indium is deposited on a portion of layer 12.

In another embodiment of the present invention, a conductive layer of either a transparent film such as tin oxide or an n-type semiconductor material such as CdS is deposited onto transparent substrate 11. Onto the conductive layer is deposited p-type semiconductor thin film layer 14. The ohmically conductive contact as described above is then deposited onto layer 14.

The preferred embodiment of the present invention can best be described by reference to a specific IIB-IVA p-type semiconductor thin film and a photovoltaic device incorporating this semiconductor whose method of construction shall now be described. The term thin film as used herein means a film having a thickness of about 0.05 to about 5 micrometers.

Fluorine doped tin oxide is deposited on a glass substrate by the reaction between tetramethyltin and oxygen in flowing He at a temperature between 450°–500° C. The sheet resistance of the tin oxide film is about 7–10 $\Omega/\square$. Cadmium sulfide is deposited onto the tin oxide coated glass substrate from an aqueous solution containing ammonium hydroxide, cadmium acetate, ammonium acetate, and thiourea at a temperature between 55°–90° C. The thickness of the cadmium sulfide layer is less than 1,000 Å. Cadmium telluride is then deposited by close-spaced sublimation onto the $CdS/SnO_2$:F/glass structure. The thickness of the CdTe layer is about 2–5 μm. This structure may be heat treated after application of a cadmium halide flux such as $CdCl_2$. The heat treatment improves the structural and electrical properties of the semiconductor structure.

The resulting structure is rinsed in deionized water prior to etching in an acidic solution such as $H_3PO_4$ $H_2O+HNO_3$ (100:40:1.25) or a 0.1% bromine in methanol solution. The etching process is believed to leave a tellurium rich surface layer on the structure which increases the surface conductivity of the contact to be fabricated on the p-CdTe layer. After etching, the structure is thoroughly rinsed in deionized water and blow-dried with nitrogen.

An ohmic contact is then formed on the p-CdTe layer. Mercury telluride is pulverized to a fine powder and mixed to a concentration of about 5–40 wt % HgTe with a graphite paste such as Electrodag 114, commercially available from Acheson Colloids Company. The graphite paste mixture is applied to the etched p-CdTe layer and allowed to air dry. The thickness of the graphite paste mixture layer is about 2–3 mils. Copper may be added to the graphite paste in the form of a Class $I_2$-VI or I-II-VI semiconductor compound, such as copper telluride, mercury copper telluride, or as a dopant in mercury telluride. The absence of any elemental or free copper eliminates shorting problems caused by the diffusion of copper into the semiconductor.

The resulting structure is then annealed in an inert atmosphere such as helium for 20–30 minutes at a temperature between 200°–300° C. The structure is then allowed to cool to room temperature. It is believed that annealing causes the partial diffusion of the semiconductor material contained in the graphite paste into the p-type semiconductor compound. Depending on the electrical properties of the graphite paste used, a second conductive layer, such as silver paste or nickel paste, may be applied to the graphite surface to lower its sheet resistance.

After mechanical scribing and removal of the excess cadmium telluride to define the solar cell, indium was soldered at about 180° C. onto the tin oxide layer to complete the solar cell.

EXAMPLE 1

A photovoltaic cell was prepared as described above. The surface of the CdTe layer was etched in a solution of $H_3PO_4+H_2O+HNO_3$ (100:40:1.25) for about 25 seconds. The cell was then rinsed in deionized water and dried in nitrogen. Graphite paste (Electrodag 114) mixed with about 40 wt % powdered mercury telluride was applied to the CdTe surface. After the cell was allowed to air dry, it was annealed at 275° C. in a He atmosphere for 25 minutes. The cell was then cooled to room temperature. A layer of silver conducting paste such as that commercially available from Acheson Colloids Company, was applied to the graphite paste layer. Table 1 shows the results of the performance testing of this cell.

EXAMPLE 2

A photovoltaic cell was prepared substantially in accordance with Example 1 except that 10 wt % powdered mercury telluride and 3.5 wt % powdered copper telluride were mixed into the graphite paste.

EXAMPLE 3

A photovoltaic cell was prepared substantially in accordance with Example 1 except that 30 wt % powdered mercury copper telluride was mixed into the graphite paste.

EXAMPLE 4

A photovoltaic cell was prepared substantially in accordance with Example 1 except that copper doped mercury telluride was mixed into the graphite paste. The mercury telluride was doped with copper by first melting together mercury telluride and 5–10% by weight of copper into a boule. Copper could also be added to the mercury telluride in the form of copper telluride. The boule was then pulverized into a powder. This powder was added to the graphite paste to form the contact layer material. The concentration of HgTe in the resulting paste was 25 wt %.

TABLE 1

| Example | Semiconductor | Open Circuit Voltage (mV) | Short Circuit Current (mA/cm$^2$) | Fill Factor (%) | Efficiency (%) |
| --- | --- | --- | --- | --- | --- |
| 1 | HgTe | 836 | 20.16 | 74.59 | 12.6 |
| 2 | HgTe & CuTe | 840 | 21.8 | 70.6 | 12.9 |
| 3 | HgCuTe | 842 | 24.13 | 74.17 | 15.1 |
| 4 | Cu doped HgTe | 858 | 23.62 | 74.61 | 15.1 |

As shown in Table 1, the semiconductor and graphite paste mixture results in fill factors over 70%. The variation in conversion efficiencies may be due to factors not related to the contacting process, such as a thick CdS layer which could limit the short circuit current density. Photovoltaic devices formed according to the present invention have conversion efficiencies of at least 10%, and preferably at least 12%. Variations to the above contacting technique may also be used to achieve high fill factors and conversion efficiencies.

The etching of the CdTe surface prior to contacting is a very important step in achieving good electrical contact. The etching time must be adjusted depending on the acid concentration. While it is important that the CdTe surface is etched long enough to achieve a tellurium rich surface, the duration of etching should not be too long, so as to allow the acidic solution to penetrate the grain boundaries. Such penetration could result in shunting paths and device degradation. It is important that the CdTe surface is thoroughly rinsed after etching to assure that the acidic solution is completely removed. Basic solutions can also be used to rinse the etched surface as disclosed in U.S. Pat. No. 4,456,630. The use of a "fast" or a "slow" etch determines the duration of the etch as well as the duration of the subsequent rinsing.

With respect to the heat treatment that follows the paste application, the important parameter is the temperature/time product. The HgTe and/or CuTe present in the graphite paste is believed to partially diffuse onto the CdTe surface and react with the CdTe. The extent of this diffusion/reaction is determined by the time/temperature product. Qualitatively, a small product will result in non-ohmic contacts, while a large product will result in overdiffusion in the grain boundaries creating shunting paths.

The highest fill factor obtained from a solar cell of the present invention was about 76%, and the highest conversion efficiency was about 15.8%.

Figure 2:
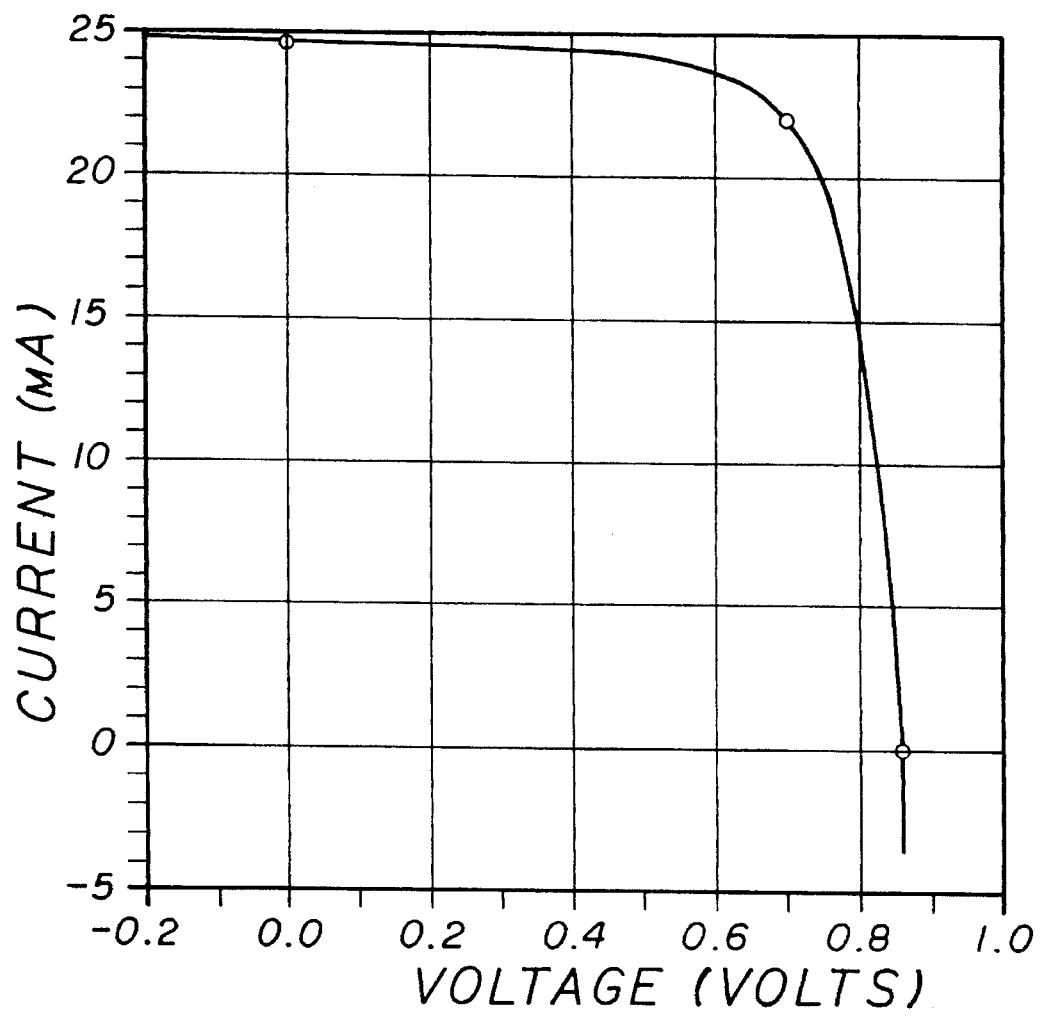
FIG. 2 is a graph of the voltage-current characteristics of a photovoltaic device prepared using the method of the present invention.

FIG. 2 shows the voltage-current characteristics for a photovoltaic cell having an ohmic contact comprising a graphite paste layer having mercury telluride and copper telluride powder dispersed therein.

The invention is not limited to the embodiments of the photovoltaic device and method which have just been described and it is intended by the following claims to include all technically equivalent means which come within the full scope and true spirit of the invention.

What we claim is:

1. A thin film photovoltaic device comprising:

(a) a transparent substrate;

(b) a first layer deposited on said transparent substrate, said first layer comprising at least one of a transparent film, and an n-type semiconductor layer;

(c) a p-type semiconductor layer deposited onto said first layer and forming a junction therewith; and (d) an ohmically conductive contact disposed over said p-type semiconductor layer comprising:

(i) a conductive layer of binder paste, said binder paste comprising graphite paste;

(ii) a semiconductor material in an amount sufficient to form a low resistance electrical contact dispersed in said conductive binder paste comprising at least one metal element selected from the group consisting of Class IB and Class IIB of the Periodic Table of the Elements and a non-metal element of Class VIA of the Periodic Table of the Elements, wherein said semiconductor material comprises mercury telluride and copper telluride.

2. A thin film photovoltaic device according to claim 1 wherein the conversion efficiency of the device is at least 10%.

3. A thin film photovoltaic device according to claim 1 wherein said semiconductor material from said binder paste is partially diffused into said p-type semiconductor layer.

4. A thin film photovoltaic device according to any of claims 1, 2, or 3 further comprising a second conductive layer deposited on said binder paste layer.

5. An ohmically conductive contact for a thin film p-type semiconductor compound formed of at least one of the metal elements of Class IIB of the Periodic Table of Elements and at least one of the non-metal elements of Class VIA of the Periodic Table of Elements comprising:

(a) a conductive layer of binder paste deposited on the p-type semiconductor compound; and (b) a semiconductor material in an amount sufficient to form a low resistance electrical contact dispersed in said conductive binder paste comprising mercury telluride and copper telluride.

6. An ohmically conductive contact for a thin film p-type semiconductor compound formed of at least one of the metal elements of Class IIB of the Periodic Table of Elements and at least one of the non-metal elements of Class VIA of the Periodic Table of Elements comprising:

(a) a conductive layer of binder paste deposited on the p-type semiconductor compound; and (b) a semiconductor material in an amount sufficient to form a low resistance electrical contact dispersed in said conductive binder paste comprising copper doped mercury telluride.

7. An ohmically conductive contact for a thin film p-type semiconductor compound formed of telluride and at least one of the metal elements of Class IIB of the Periodic Table of Elements, comprising:

(a) a conductive layer of binder paste deposited on the p-type semiconductor compound; and (b) a semiconductor material in an amount sufficient to form a low resistance electrical contact dispersed in said conductive binder paste comprising at least one metal element selected from Class IB and Class IIB of the Periodic Table of the Elements and a non-metal element of Class VIA of the Periodic Table of the Elements, wherein said semiconductor material comprises mercury telluride and copper telluride.

8. An ohmically conductive contact for a thin film p-type semiconductor compound formed of telluride and at least one of the metal elements of Class IIB of the Periodic Table of Elements, comprising:

(a) a conductive layer of binder paste deposited on the p-type semiconductor compound; and (b) a semiconductor material in an amount sufficient to form a low resistance electrical contact dispersed in said conductive binder paste comprising at least one metal element selected from Class IB and Class IIB of the Periodic Table of the Elements and a non-metal element of Class VIA of the Periodic Table of the Elements, wherein said semiconductor material comprises copper doped mercury telluride.

9. An ohmically conductive contact for a thin film p-type semiconductor compound formed of cadmium and at least one of the non-metal elements of Class VIA of the Periodic Table of Elements comprising:

(a) a conductive layer of binder paste deposited on the p-type semiconductor compound; and (b) a semiconductor material in an amount sufficient to form a low resistance electrical contact dispersed in said conductive binder paste comprising at least one metal element selected from Class IB and Class IIB of the Periodic Table of the Elements and a non-metal element of Class VIA of the Periodic Table of the Elements, wherein said semiconductor material comprises mercury telluride and copper telluride.

10. An ohmically conductive contact for a thin film p-type semiconductor compound formed of cadmium and at least one of the non-metal elements of Class VIA of the Periodic Table of Elements comprising:

(a) a conductive layer of binder paste deposited on the p-type semiconductor compound; and (b) a semiconductor material in an amount sufficient to form a low resistance electrical contact dispersed in said conductive binder paste comprising at least one metal element selected from Class IB and Class IIB of the Periodic Table of the Elements and a non-metal element of Class VIA of the Periodic Table of the Elements, wherein said semiconductor material comprises copper doped mercury telluride.

11. An ohmically conductive contact for a thin film p-type semiconductor compound formed of cadmium, at least one other of the metal elements of Class IIB of the Periodic Table of Elements, and at least one of the non-metal elements of Class VIA of the Periodic Table of Elements comprising:

(a) a conductive layer of binder paste deposited on the p-type semiconductor compound; and (b) a semiconductor material in an amount sufficient to form a low resistance electrical contact dispersed in said conductive binder paste comprising at least one metal element selected from Class IB and Class IIB of the Periodic Table of the Elements and a non-metal element of Class VIA of the Periodic Table of the Elements, wherein said semiconductor material comprises mercury telluride and copper telluride.

12. An ohmically conductive contact for a thin film p-type semiconductor compound formed of cadmium, at least one other of the metal elements of Class IIB of the Periodic Table of Elements, and at least one of the non-metal elements of Class VIA of the Periodic Table of Elements comprising:

(a) a conductive layer of binder paste deposited on the p-type semiconductor compound; and (b) a semiconductor material in an amount sufficient to form a low resistance electrical contact dispersed in said conductive binder paste comprising at least one metal element selected from Class IB and Class IIB of the Periodic Table of the Elements and a non-metal element of Class VIA of the Periodic Table of the Elements, wherein said semiconductor material comprises copper doped mercury telluride.

13. A thin film photovoltaic device comprising:

(a) a transparent substrate;

(b) a first layer deposited on said transparent substrate, said first layer comprising at least one of a transparent film, and an n-type semiconductor layer;

(c) a p-type semiconductor layer deposited onto said first layer and forming a junction therewith; and (d) an ohmically conductive contact disposed over said p-type semiconductor layer comprising:

(i) a conductive layer of binder paste;

(ii) a semiconductor material in an amount sufficient to form a low resistance electrical contact dispersed in said conductive binder paste, said semiconductor material comprising mercury telluride and copper telluride.

14. A thin film photovoltaic device according to claim 13 wherein the conversion efficiency of the device is at least 10%.

15. A thin film photovoltaic device according to claim 13 wherein said semiconductor material from said binder paste is partially diffused into said p-type semiconductor layer.

16. An ohmically conductive contact according to any of claims 5, 6, 7, 8, 9, 10, 11, 12, 13, 14, or 15 wherein said conductive binder paste comprises graphite paste.

* * * * *